United States Patent
Chiu et al.

(10) Patent No.: US 11,239,109 B2
(45) Date of Patent: Feb. 1, 2022

(54) SEMICONDUCTOR MEMORY HAVING REDUCED INTERFERENCE BETWEEN BIT LINES AND WORD LINES

(71) Applicants: Semiconductor Manufacturing International (Shanghai) Corporation, Shanghai (CN); Semiconductor Manufacturing International (Beijing) Corporation, Beijing (CN)

(72) Inventors: Shengfen Chiu, Shanghai (CN); Liang Chen, Shanghai (CN); Liang Han, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/046,731

(22) Filed: Jul. 26, 2018

(65) Prior Publication Data

US 2019/0067080 A1  Feb. 28, 2019

(30) Foreign Application Priority Data

Aug. 28, 2017 (CN) .......................... 201710751182.X

(51) Int. Cl.
*H01L 27/11* (2006.01)
*H01L 21/764* (2006.01)
(Continued)

(52) U.S. Cl.
CPC ...... *H01L 21/764* (2013.01); *H01L 21/31111* (2013.01); *H01L 21/768* (2013.01);
(Continued)

(58) Field of Classification Search
CPC . H01L 21/764; H01L 29/4991; H01L 29/515; H01L 21/768; H01L 29/42324;
(Continued)

(56) References Cited

U.S. PATENT DOCUMENTS

| 9,035,419 B2 * | 5/2015 | Oh ..................... H01L 21/76224 257/522 |
| 2007/0048985 A1 * | 3/2007 | Jawarani ........... H01L 29/66507 438/581 |

(Continued)

FOREIGN PATENT DOCUMENTS

CN  102479811  5/2012

OTHER PUBLICATIONS

Chinese Application No. 201710751182.X, Office Action dated Mar. 13, 2020, 6 pages.

*Primary Examiner* — S M Sohel Imtiaz
(74) *Attorney, Agent, or Firm* — Anova Law Group, PLLC

(57) ABSTRACT

A flash memory device includes a substrate, a plurality of active regions and a plurality of first isolation regions alternately arranged in a first direction and extending in a second direction different from the first direction, a plurality of gate structures on the substrate, the gate structures being spaced apart from each other and extending in the second direction, a gap structure between the gate structures, and a second isolation region filling an upper portion of the gap structure and leaving a first air gap in a lower portion of the gap structure.

9 Claims, 8 Drawing Sheets

(51) Int. Cl.
- *H01L 27/11521* (2017.01)
- *H01L 21/311* (2006.01)
- *H01L 21/8234* (2006.01)
- *H01L 29/06* (2006.01)
- *H01L 21/768* (2006.01)
- *H01L 29/423* (2006.01)
- *H01L 29/49* (2006.01)
- *H01L 29/51* (2006.01)

(52) U.S. Cl.
CPC ........... *H01L 21/823481* (2013.01); *H01L 27/11521* (2013.01); *H01L 29/0649* (2013.01); *H01L 29/42324* (2013.01); *H01L 29/4991* (2013.01); *H01L 29/515* (2013.01)

(58) Field of Classification Search
CPC ......... H01L 27/11521; H01L 21/31111; H01L 21/823481; H01L 29/0649; H01L 27/11524
See application file for complete search history.

(56) References Cited

U.S. PATENT DOCUMENTS

| | | | |
|---|---|---|---|
| 2007/0141798 A1* | 6/2007 | Bohr | H01L 29/78 438/301 |
| 2009/0023279 A1* | 1/2009 | Kim | H01L 21/764 438/594 |
| 2010/0172066 A1* | 7/2010 | Baer | B32B 27/36 361/323 |
| 2010/0221904 A1* | 9/2010 | Brazzelli | H01L 21/764 438/586 |
| 2010/0230741 A1* | 9/2010 | Choi | H01L 21/76229 257/324 |
| 2012/0064707 A1* | 3/2012 | Yang | H01L 27/11568 438/588 |
| 2012/0132982 A1* | 5/2012 | Lee | H01L 21/7682 257/321 |
| 2013/0214417 A1* | 8/2013 | Lazzari | H01L 29/0657 257/754 |
| 2014/0021524 A1* | 1/2014 | Sim | H01L 27/11521 257/314 |
| 2015/0054054 A1* | 2/2015 | Ahn | H01L 27/11521 257/321 |
| 2015/0187781 A1* | 7/2015 | Hong | H01L 21/32137 257/316 |
| 2015/0243544 A1* | 8/2015 | Alptekin | H01L 29/6653 438/586 |
| 2015/0380425 A1* | 12/2015 | Ogata | H01L 29/788 257/324 |
| 2016/0260726 A1* | 9/2016 | Shin | H01L 21/823462 |
| 2016/0372601 A1* | 12/2016 | Yamanaka | H01L 29/40114 |
| 2017/0330955 A1* | 11/2017 | Rahhal-Orabi | H01L 29/66545 |
| 2018/0040560 A1* | 2/2018 | Kim | H01L 23/5329 |
| 2018/0350932 A1* | 12/2018 | Liu | H01L 29/66439 |
| 2018/0366486 A1* | 12/2018 | Hada | H01L 27/11556 |

* cited by examiner

SEMICONDUCTOR MEMORY HAVING REDUCED INTERFERENCE BETWEEN BIT LINES AND WORD LINES

CROSS-REFERENCES TO RELATED APPLICATIONS

The present application claims priority to Chinese patent application No. 201710751182.X, filed with the State Intellectual Property Office of People's Republic of China on Aug. 28, 2017, the content of which is incorporated herein by reference in its entirety.

FIELD OF THE INVENTION

The present invention relates to semiconductor technology, and more particularly to a flash memory device and manufacturing method thereof.

BACKGROUND OF THE INVENTION

As technology nodes continue to evolve, the feature sizes of flash memory devices continue to shrink, the spacing between two adjacent bit lines and the spacing between two adjacent word lines are getting smaller and smaller, so that severe interference occurs between bit lines and between word lines, thereby adversely affecting the performance of flash memory devices.

Thus, there is a need for solutions to reduce or eliminate interference noise between bit lines and/or word lines.

BRIEF SUMMARY OF THE INVENTION

Embodiments of the present invention involve a novel semiconductor device structure and manufacturing method of the structure that facilitate a reduction of interference between bit lines and between word lines.

According to an aspect of the present invention, a flash memory device may include a substrate, a plurality of active regions and a plurality of first isolation regions alternately arranged in a first direction and extending in a second direction different from the first direction, a plurality of gate structures on the substrate, the gate structures being spaced apart from each other and extending in the second direction, a gap structure between the gate structures, and a second isolation region filling an upper portion of the gap structure and leaving a first air gap in a lower portion of the gap structure.

In one embodiment, each of the gate structures includes a tunneling dielectric layer on an active region, a floating gate on the tunneling dielectric layer, an intergate dielectric layer on the floating gate, and a control gate on the intergate dielectric layer.

In one embodiment, the second isolation region has a bottom surface higher than a bottom surface of the control gate.

In one embodiment, the flash memory device may further include a metal silicide on the control gate.

In one embodiment, the flash memory device may further include a second air gap formed in the first isolation regions, the active regions and the gate structures. The first isolation regions each have an upper surface lower than an upper surface of the active regions.

In one embodiment, the first air gap and the second air gap are in fluid communication with each other.

Embodiments of the present invention also provide a method for manufacturing a flash memory device. The method may include providing a substrate structure including a substrate, a plurality of active regions and a plurality of first isolation regions alternately arranged in a first direction and extending in a second direction different from the first direction, a plurality of gate structures on the substrate, the gate structures being spaced apart from each other and extending in the second direction, and a gap structure between the gate structures. The method also may provide forming an overhang surrounding an upper portion of the gate structures to form a gap structure between the gate structures, and forming a second isolation region filling an upper portion of the gap structures and leaving a first air gap between the gap structures.

In one embodiment, forming the overhang includes forming an overhang material layer on the gate structures, the overhang material layer including a first portion surrounding an upper portion of the gate structures and a second portion on sidewalls of a lower portion of the gate structures and on a surface portion of the substrate between the gate structures, and performing a wet etching process to remove the second portion and a portion of the first portion to form the overhang.

In one embodiment, the first portion of the overhang material layer includes a plurality of overhang portions, each of the overhang portions is disposed on a gate structure, and the overhang portions are in physical contact with each other.

In one embodiment, the wet etching process includes applying an etchant comprising phosphoric acid.

In one embodiment, the overhang material layer includes silicon nitride or silicon oxynitride.

In one embodiment, the gate structures each include a tunneling dielectric layer on an active region, a floating gate on the tunneling dielectric layer, an intergate dielectric layer on the floating gate, and a control gate on the intergate dielectric layer.

In one embodiment, each of the gate structures further includes a hardmask layer on the control gate.

In one embodiment, the overhang surrounds an upper portion of the control gate.

In one embodiment, the second isolation region has a bottom surface that is higher than a bottom surface of the control gate.

In one embodiment, the method may further include removing the overhang and a portion of the second isolation region to expose a portion of the control gate, and forming a metal layer on the exposed portion of the control gate to form a metal silicide.

In one embodiment, the method may further include, after forming the overhang surrounding an upper portion of the gate structures, removing a portion of the first isolation regions to form a second air gap between adjacent active regions.

In one embodiment, removing the portion of the first isolation regions includes applying an etchant comprising diluted hydrofluoric acid.

In one embodiment, the first air gap and the second air gap are in fluid communication with each other.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Figure 1:
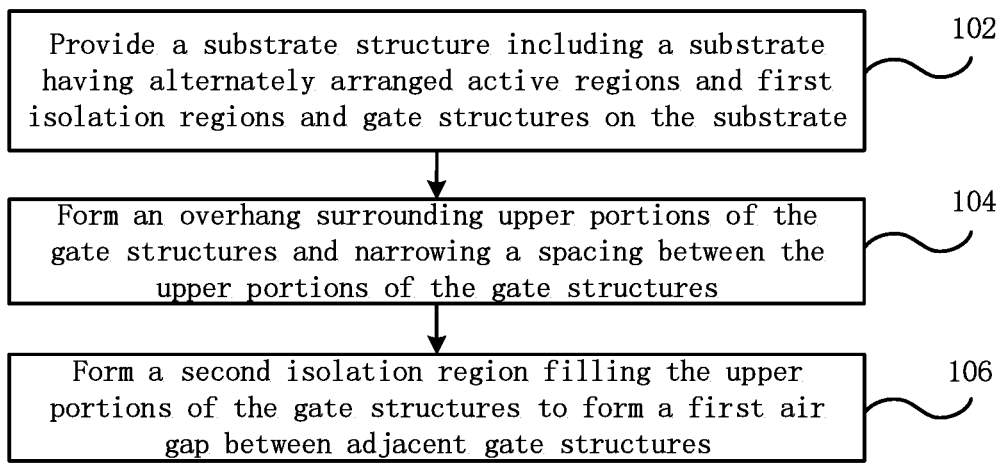
FIG. 1 is a simplified flowchart illustrating some of the main steps in a method for manufacturing a flash memory device according to one embodiment of the present invention.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The embodiments described and references in the disclosure to "one embodiment," "an embodiment," "an exemplary embodiment" indicate that the embodiments described may include a particular feature, structure, or characteristic. However, every embodiment may not necessary include the particular feature, structure or characteristic. As used throughout this disclosure, the terms "depositing" and "forming" are used interchangeably.

Embodiments of the present invention now will be described more fully hereinafter with reference to the accompanying drawings, in which embodiments of the invention are shown. This invention may, however, be embodied in many different forms and should not be construed as limited to the embodiments set forth herein.

FIG. 1 is a simplified flowchart of a method for manufacturing a semiconductor device according to one embodiment of the present invention. FIGS. 2A through 10 are cross-sectional views illustrating intermediate stages of a semiconductor device in some of the main steps in a manufacturing method according to some embodiments of the present invention.

A method for manufacturing a flash memory device according to some embodiments of the present invention will be described in detail below with reference to FIG. 1 and FIGS. 2A to 10.

Referring to FIG. 1, the method may include providing a substrate structure at step 102.

Figure 2A:
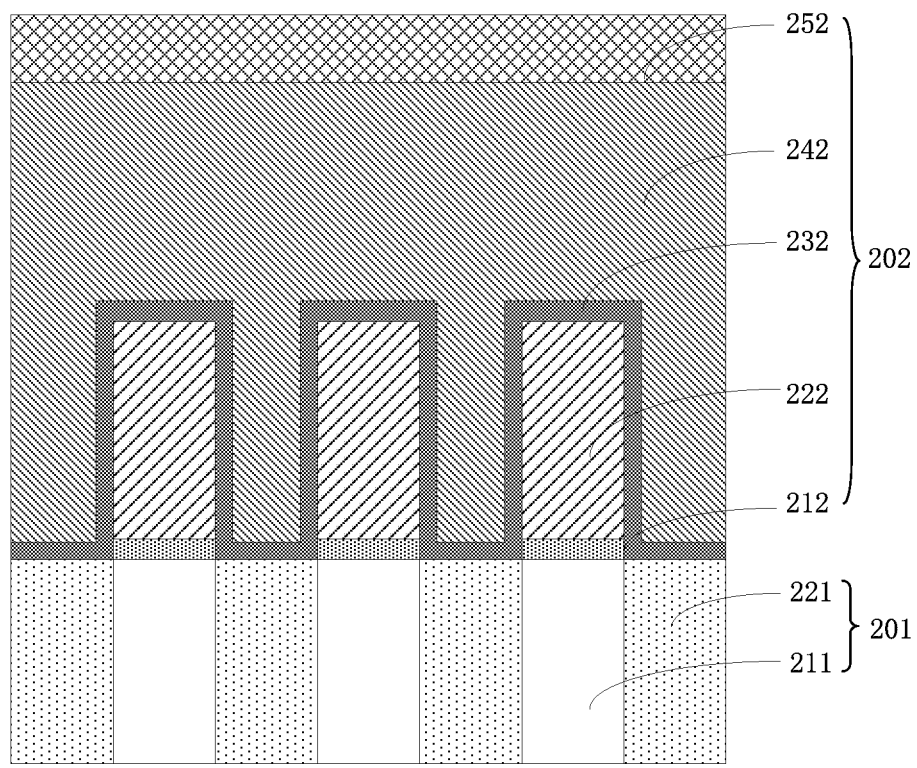
FIGS. 2A through 10 are cross-sectional views illustrating intermediate stages of a flash memory device in some of the main steps in a manufacturing method according to one embodiment of the present invention.
Figure 2B:
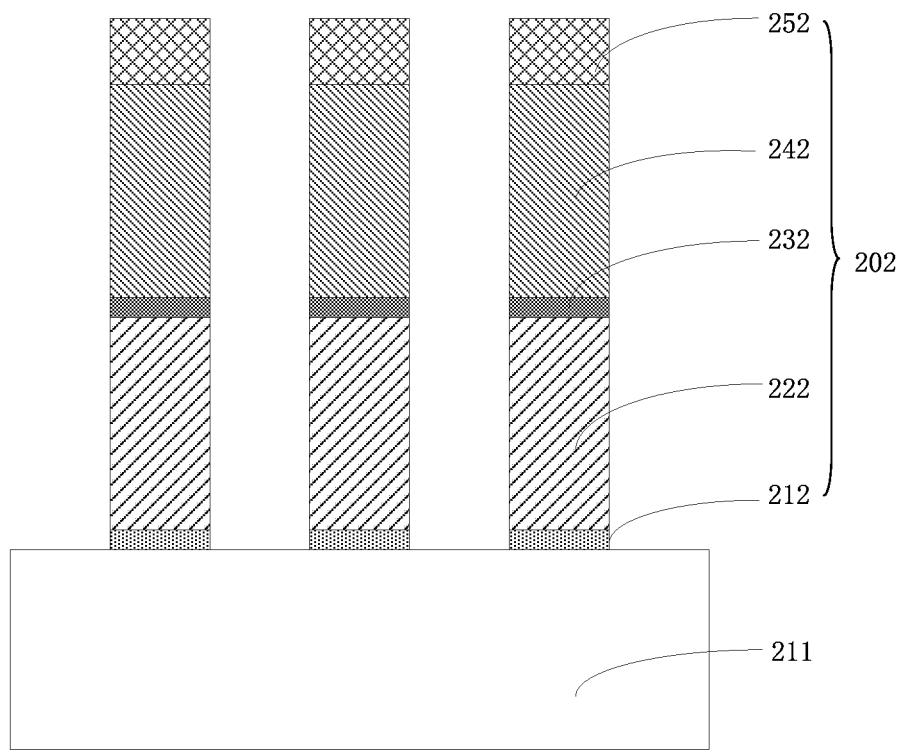

FIG. 2A is a cross-sectional view of a substrate structure taken along a first direction according to an embodiment of the present invention. FIG. 2B is a cross-sectional view of the substrate structure of FIG. 2A taken along a second direction different from the first direction. In one embodiment, the first direction and the second direction are substantially perpendicular to each other.

Referring to FIGS. 2A and 2B, the substrate structure may include a substrate 201 and a plurality of gate structures 202 on the substrate 201. The substrate 201 may include a plurality of active regions 211 and a plurality of first isolation regions 221. The plurality of active regions 211 and the plurality of first isolation regions 221 are alternately arranged in the first direction and extend along the second direction. The gate structures 202 are spaced apart from each other in the second direction, i.e., there is a gap (spacing) between two adjacent gate structures 202. In addition, the gate structures 202 also extend along the first direction. In one embodiment, the active regions each may include a semiconductor substrate and a well region. The active regions each may be used to form a source region and a drain region.

In one embodiment, each gate structure may include a tunnel dielectric layer 212 on the active region 211, a floating gate 222 on the tunnel dielectric layer 212, an intergate dielectric layer 232 on the floating gate 222, and a control gate 242 on the intergate dielectric layer 232. In another embodiment, the gate structure may also include a hardmask layer 252 on the control gate 242. It should be noted that the tunnel dielectric layer 212 and the floating gate 222 disposed on the tunnel dielectric layer 212 may include a plurality of spaced apart segments that are arranged along the first direction. In some embodiments, the control gate 242 may be configured to operate as a word line.

In one embodiment, the tunnel dielectric layer 212 may include silicon oxide. In an exemplary embodiment, the floating gate 222 and the control gate 242 each may include polysilicon. In an exemplary embodiment, the intergate dielectric layer 232 may include silicon oxide or silicon nitride. In one embodiment, the intergate dielectric layer 232 may be a stack structure having a silicon oxide layer, a silicon nitride layer, and a silicon oxide layer formed on top of each other, e.g., an ONO structure.

Next, referring back to FIG. 1, the method may include forming an overhang that surrounds an upper portion of each of the gate structures at step 104. The overhang reduces the gap opening (spacing) between two adjacent gate structures.

Figure 3:
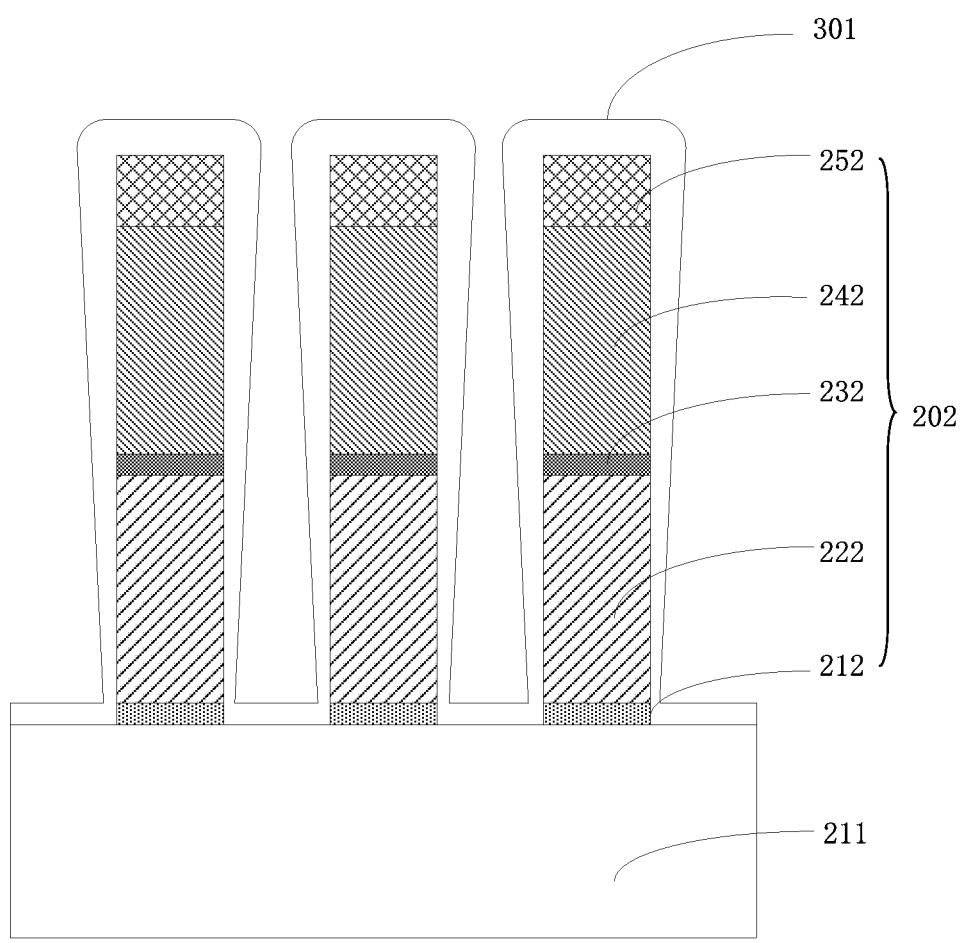
Figure 4:
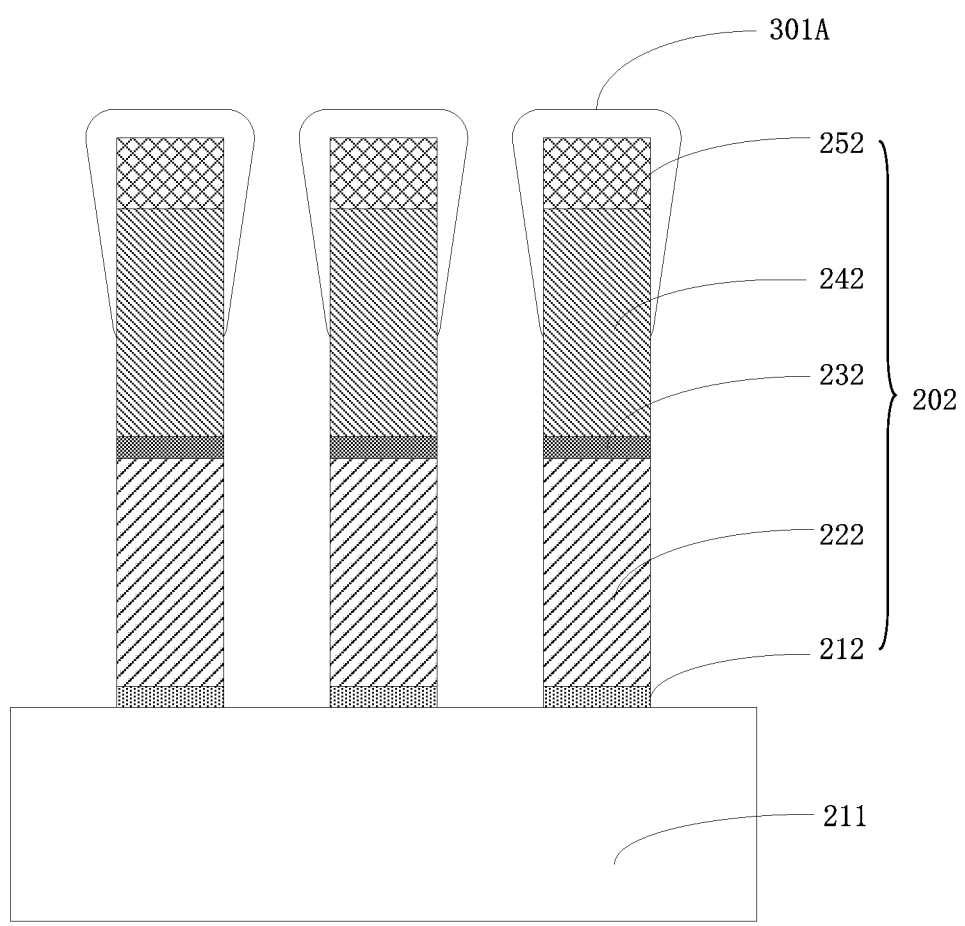

In one embodiment, the overhang may be formed by processes shown in FIGS. 3 and 4.

Referring to FIG. 3, an overhang material layer 301 is formed on the substrate structure. Herein, the overhang material layer 301 surrounding the upper portion of the gate structure 202 is referred to as a first portion, and the overhang material layer 301 formed on sidewalls of the lower portion of the gate structure 202 is referred to as a second portion. The first portion has a thickness that is greater than the thickness of the second portion. In one embodiment, the first portion of the overhang material layer 301 surrounding the upper portions of two adjacent gate structures 202 may be in physical contact with each other, i.e., the overhang material layer 301 surrounding the upper portions of the gate structures 202 may be merged together.

In one embodiment, the overhang material layer 301 may include silicon nitride (SiN) or silicon oxynitride (SiON). In one embodiment, the overhang material layer 301 may be formed by a relatively high deposition rate, e.g., using a chemical vapor deposition (CVD) process, so that the thickness of the first portion is greater than the thickness of the second portion.

As those of skill in the art will appreciate, the above-described upper portion and the lower portions of the gate structure 202 are merely relative concepts. For example, the portion of the gate structure 202 in the vicinity of the top surface may be referred to as the upper portion, and the remaining portion of the gate structure 202 may be referred to as the lower portion. In an example embodiment, the upper portion of the gate structure 202 may include the hardmask layer 252 and a portion of the control gate 242. The remaining portion of the control gate 242, the intergate dielectric layer 232, the floating gate 222, and the tunnel dielectric layer 212 may be referred to as the lower portion of the gate structure 202.

Referring to FIG. 4, a wet etching process is performed on the gate structure. The wet etching process removes the entire second portion of the overhang material layer 301 while retaining a portion of the first portion of the overhang material layer 301. Since the wet etching process is substantially isotropic, therefore, the wet etching process causes the thinning of the first portion so that a remaining portion of the first portion (the thinned first portion) produces the overhang 301A. The overhang 301A reduces the gap opening (spacing) between adjacent gate structures. In one embodiment, the overhang 301A may surround the upper portion of the control gate 242.

In one embodiment, the wet etching process may include applying an etchant including phosphoric acid. Further, in the case where the first portions of the overhang material layer 301 surrounding the upper portions of adjacent gate structures 202 are in contact with (or connected to) each other, the etching process may also physically separate the first portions.

Next, referring back to FIG. 1, at step 106, the method may further include forming a second isolation region filling a top portion of the gap opening between adjacent gate structures, so that a first air gap below the filled top portion of the gap opening between adjacent gate structures is formed.

Figure 5:
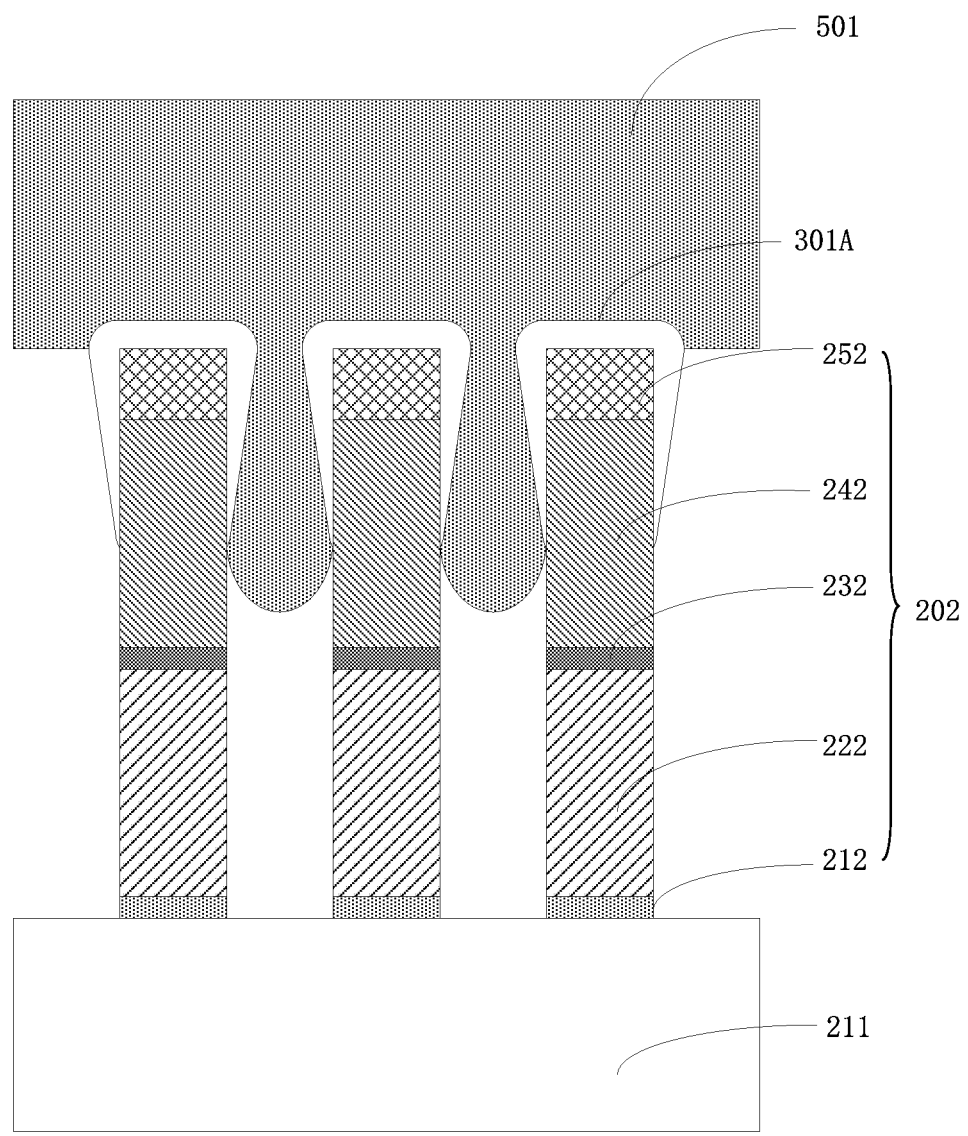

Referring to FIG. 5, an isolation material (e.g., polymer) 501 is deposited on the gate structures. Since the overhang 301A surrounds the upper portions of the gate structures 202, the isolation material 501 only fills the upper portion of the gap opening between adjacent gate structures 202.

Figure 6:
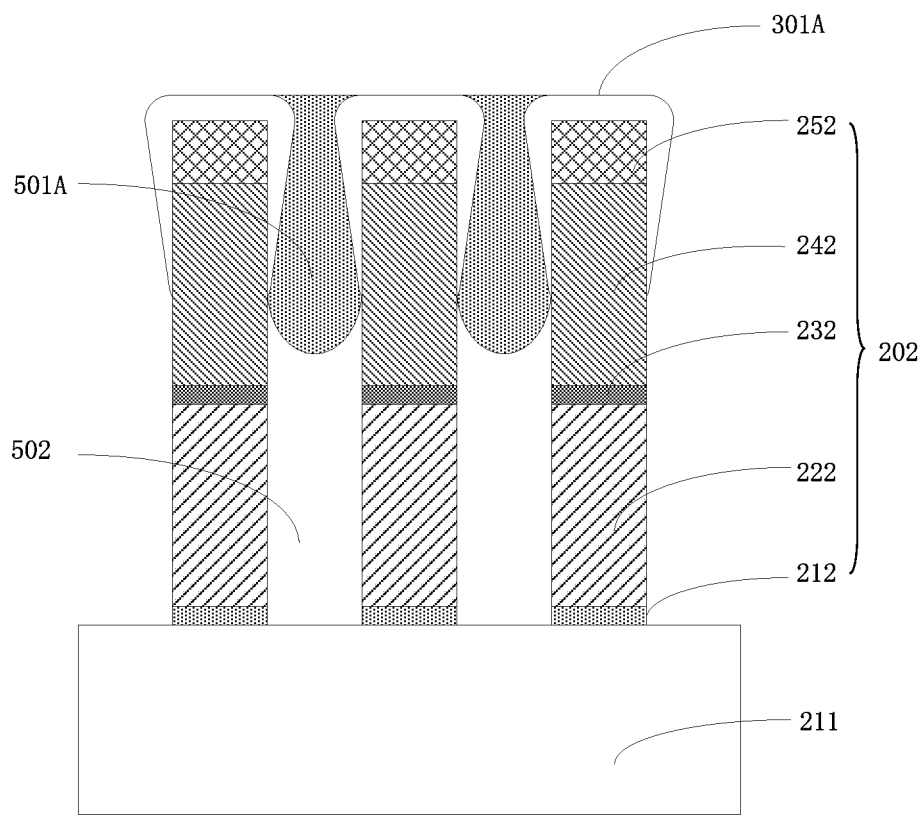

Referring to FIG. 6, a planarization (e.g., chemical mechanical polishing) process is performed on the isolation material 501. The planarized isolation material 501 filling the upper portion of the air gap is referred to as the second isolation region 501A, and the lower portion of the gap opening is referred to as the first air gap 502. In one embodiment, the second isolation region 501A has a bottom surface that is higher than a bottom surface of the control gate 242.

In the embodiment, by forming the overhang on the upper portion of the gate structures, the second isolation region can only be formed on the upper portion of the gap opening between adjacent gate structures, and there is an air gap formed in the lower portion of the gap opening. In this way, when the control gate is configured to operate as a word line, the parasitic capacitance between word lines can be reduced, thereby reducing interference between word lines.

Figure 7:
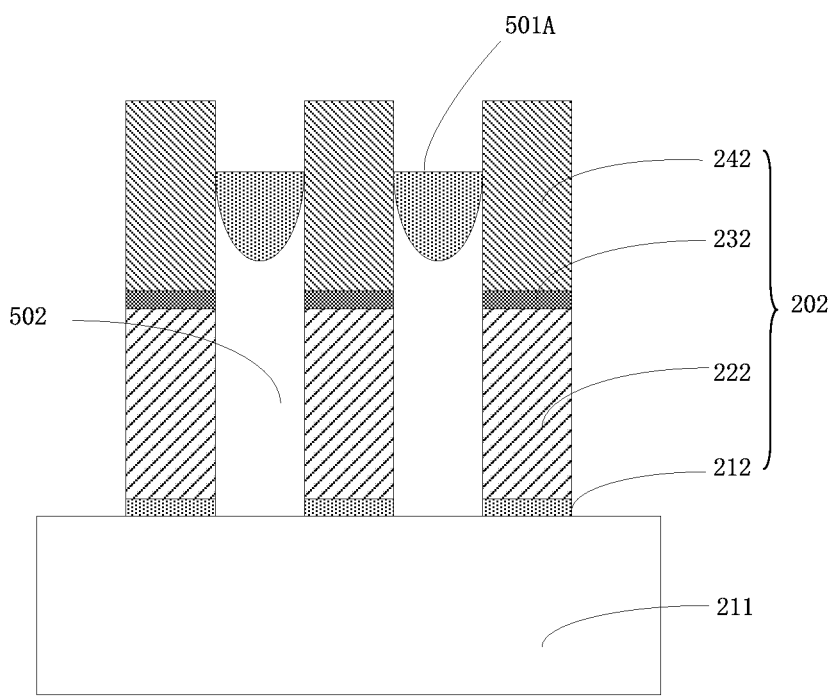

Referring to FIG. 7, after forming the second isolation region 501A, the method may further include removing the overhang 301A and a portion of the second isolation region 501A to expose a portion of the control gate 242. In the embodiment, if the gate structure 202 includes the hardmask layer 252, the hardmask layer 252 is also removed after removing the overhang 301A.

Figure 8A:
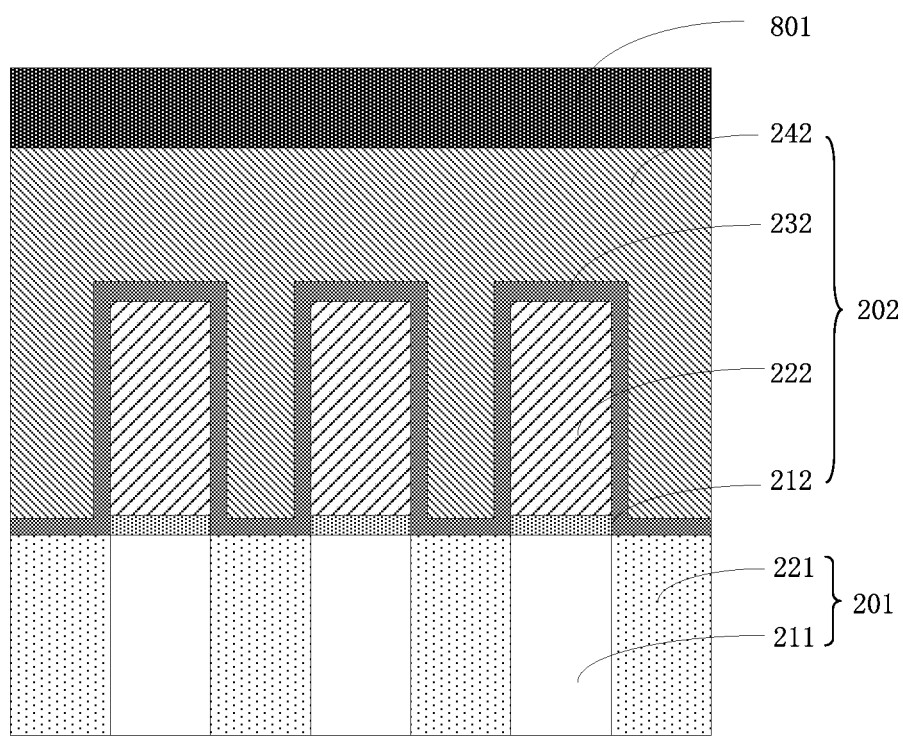
Figure 8B:
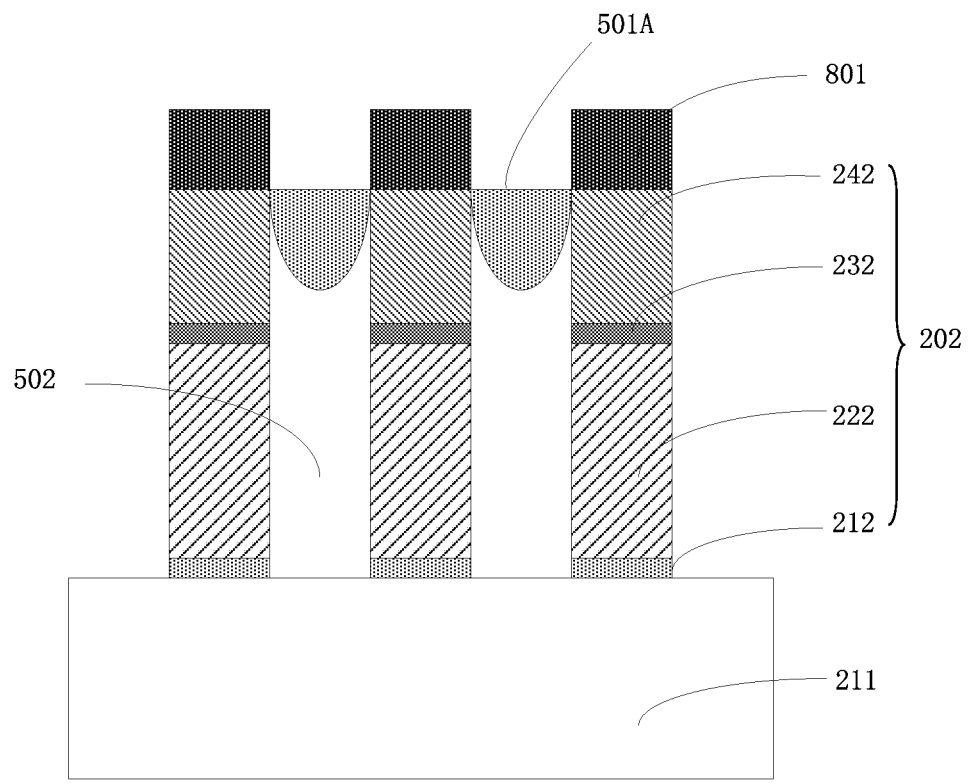

Next, referring to FIG. 8A and FIG. 8B, the method further includes forming a metal layer such that a metal silicide (e.g., NiSi) 801 is formed on the exposed portion of the control gate 242. Since the second isolation region 501A has been formed over the first air gap, the metal layer is not formed in the first air gap between the gate structures 202.

Figure 9:
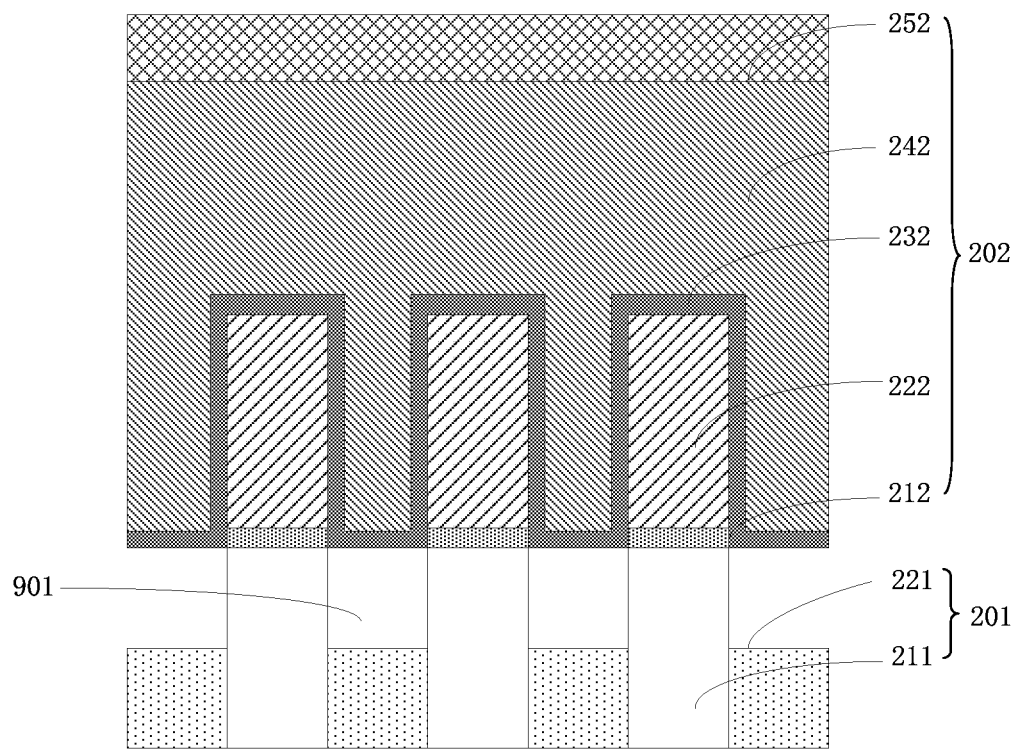

In some embodiments, after step 104 (i.e., the process shown in FIG. 4), a portion of the first isolation regions 221 may also be removed, thereby forming a second air gap 901 between adjacent active regions 211. Referring to FIG. 9, a portion of the first isolation regions 221 is removed, e.g., using an etchant including a diluted hydrofluoric acid (DHF) in one embodiment.

Figure 10:
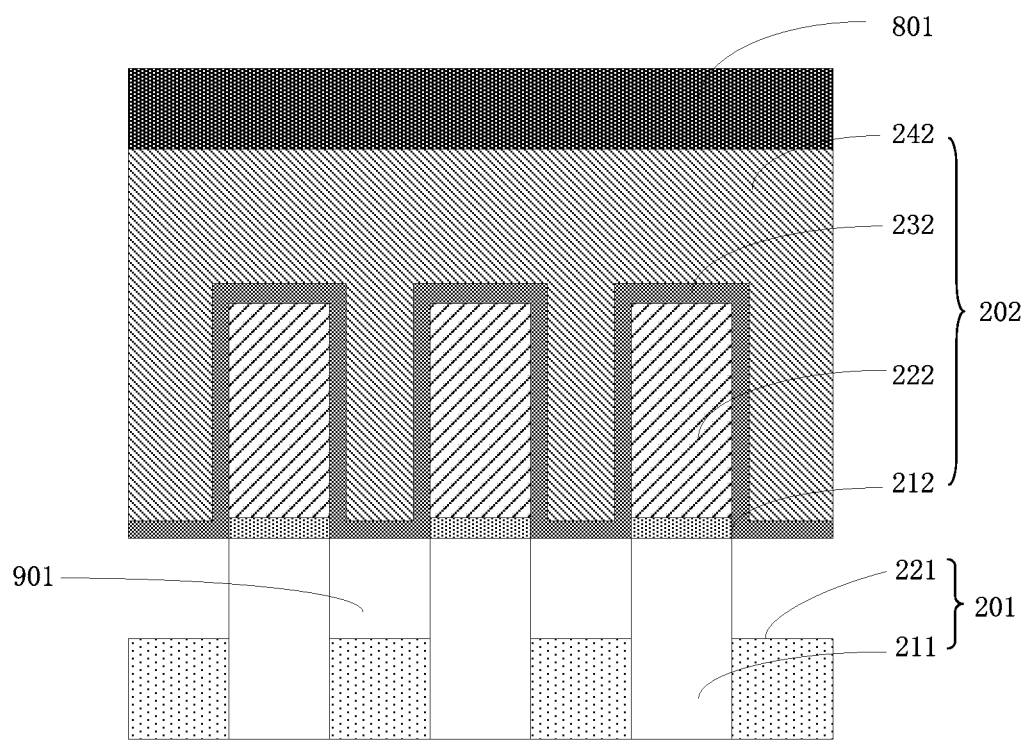

After forming the second air gap 901, other process steps, e.g., step 106, may be performed in the manner described in the above sections. In other words, the second air gap 901 may be first formed, thereafter the first air gap 502 is then formed. FIG. 10 is a cross-sectional view of a flash memory structure having a metal silicide formed along the first direction. In one embodiment, the second air gap 901 and the first air gap 502 are in fluid communication with each other. The first air gap 502 extends in the first direction, and the second air gap 901 extends in the second direction.

Since the second air gap 901 is formed between the active regions 211, the parasitic capacitance between the bit lines can be reduced, thereby reducing the interference between the bit lines.

It will be appreciated that embodiments of the present invention also provide a flash memory device. Referring to FIG. 8A and FIG. 8B, the flash memory device may include a substrate 201 including a plurality of active regions 211 and a plurality of first isolation regions 221 that are alternately arranged in a first direction and extend in a second direction different from the first direction.

The flash memory device may further include a plurality of gate structures 202 on the substrate 201 spaced apart from each other in the second direction and extending in the first direction, i.e., there is a gap between two adjacent gate structures.

The flash memory device may also include a second isolation region 501A filling an upper portion of the gap between adjacent gate structures. There is a first air gap 502 in a lower portion of the gap between adjacent gate structures.

In one embodiment, each gate structure may include a tunnel dielectric layer 212 on the active region 211, a floating gate 222 on the tunnel dielectric layer 212, an intergate dielectric layer 232 on the floating gate 222, and a control gate 242 on the intergate dielectric layer 232. In one embodiment, the second isolation region 501A has a bottom surface that is higher than a bottom surface of the control gate 242. In one embodiment, the flash memory device may also include a metal silicide 801 on the control gate 242.

In another embodiment, referring to FIG. 10, the first isolation region 221 has an upper surface that is lower than an upper surface of the active region 211, and there is a second air gap 901 formed between the first isolation region 221, the active region 211, and the gate structure 202. In other words, the first isolation region 221 delineates a first side of the second air gap 901, the active region delineates a second side of the second air gap 901, and the gate structure 202 delineates a third side of the second air gap 901. In one embodiment, the first air gap 502 and the second air gap 901 are in fluid communication with each other.

Embodiments of the present invention thus provide a flash memory device. The flash memory device may include a NAND flash memory device, but is not limited thereto. According to embodiments of the present invention, the interference problems between bit lines and word lines associated with the prior art can be mitigated or eliminated, and the performance of the flash memory device is improved.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A flash memory device, comprising:
   a substrate;
   a plurality of active regions and a plurality of isolation regions alternately arranged in a first direction and extending in a second direction different from the first direction;
   a plurality of gate structures on the substrate, the gate structures being spaced apart from each other and extending in the second direction, wherein each gate structure of the plurality of gate structures comprises a tunneling dielectric layer on an active region of the plurality of active regions, a floating gate on the tunneling dielectric layer, an intergate dielectric layer on the floating gate, and a control gate on the intergate dielectric layer;
   a gap structure between the gate structures;
   an isolation material having a convex bottom filling an upper portion of the gap structure and a top surface coplanar with a top surface of the plurality of gate structures, and leaving a first air gap in a lower portion of the gap structure; and
   a metal layer on the control gate and not on the first air gap,
   wherein the first air gap comprises a bottom surface coplanar with a bottom surface of the tunneling dielectric layer, and
   the metal layer has a bottom surface coplanar with the top surface of the isolation material.

2. The flash memory device of claim 1, wherein the convex bottom of the isolation material is higher than a bottom surface of the control gate.

3. The flash memory device of claim 1, further comprising:
   a metal silicide on the control gate.

4. The flash memory device of claim 1, further comprising a second air gap formed in the isolation regions, the active regions and the gate structures, wherein the isolation regions have an upper surface lower than an upper surface of the active regions.

5. The flash memory device of claim 4, wherein the first air gap and the second air gap are in fluid communication with each other.

6. The flash memory device of claim 1, wherein the isolation material comprises a polymer.

7. The flash memory device of claim 1, wherein the metal layer comprises NiSi.

8. The flash memory device of claim 1, further comprising a second air gap delineated by the isolation regions, the active regions, and the gate structures.

9. The flash memory device of claim 1, wherein the flash memory device comprises an NAND flash memory device.

* * * * *